United States Patent
Jacobs

(10) Patent No.: US 7,042,232 B1
(45) Date of Patent: May 9, 2006

(54) CABLE AND SUBSTRATE COMPENSATING CUSTOM RESISTOR

(75) Inventor: Lawrence W. Jacobs, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 11/018,059

(22) Filed: Dec. 20, 2004

Related U.S. Application Data

(60) Provisional application No. 60/531,555, filed on Dec. 18, 2003.

(51) Int. Cl.
 *G01R 27/04* (2006.01)
 *G01R 31/02* (2006.01)

(52) U.S. Cl. .................... 324/641; 324/72.5

(58) Field of Classification Search ........... 324/72.5, 324/72, 149, 629, 641, 126; 702/91; 333/244, 333/81 R; 338/9, 60
See application file for complete search history.

(56) References Cited

U.S. PATENT DOCUMENTS

| | | | | |
|---|---|---|---|---|
| 2,755,436 | A * | 7/1956 | Heinz ........................ 324/641 |
| 4,743,839 | A * | 5/1988 | Rush ........................ 324/72.5 |
| 5,149,200 | A * | 9/1992 | Shiokawa et al. .......... 374/185 |
| 5,311,440 | A * | 5/1994 | Hess, Jr. ..................... 324/615 |
| 5,940,579 | A * | 8/1999 | Kallgren et al. ............ 392/433 |
| 5,945,905 | A * | 8/1999 | Mazzochette ............... 338/51 |
| 6,094,042 | A * | 7/2000 | Whiteman ................. 324/72.5 |
| 6,097,276 | A * | 8/2000 | Van Den Broek et al. ...... 338/9 |
| 6,822,463 | B1 * | 11/2004 | Jacobs ........................ 324/715 |
| 6,856,126 | B1 * | 2/2005 | McTigue et al. ........... 324/72.5 |
| 6,873,162 | B1 * | 3/2005 | Bois et al. .................. 324/638 |

OTHER PUBLICATIONS

LeCroy WaveLink Probe System Unprecedented Flexibility for Probe Interconnection; 2005; 6 pages.
LeCroy Digital Oscilloscopes—Differential Probes—WaveLink Differential Probe Family; at least as early as Oct. 25, 2004; 16 pages; http://www.lecroy.com/tm/products/Probes/Differential/WaveLink/default.asp.

* cited by examiner

*Primary Examiner*—Diane Lee
*Assistant Examiner*—Hoai-An D. Nguyen
(74) *Attorney, Agent, or Firm*—Law Office of Karen Dana Oster, LLC

(57) ABSTRACT

A compensating resistor includes a substrate with a first termination at one end and a second termination at the other end. A frontside resistor is on the frontside of the substrate and extends between the first termination and the second termination. A backside resistor is on the backside of the substrate. One end of the backside resistor is attached to the first termination, but the other end of the backside resistor is free from the second termination. The frontside resistor and the backside resistor are capacitively coupled through the substrate. An alternative embodiment has includes a metal termination pad on the substrate backside to which the free end of the backside resistor connects. The compensating resistor preferably has an attenuation that decreases proportionally to the square root of frequency over the range of frequencies.

12 Claims, 7 Drawing Sheets

CABLE AND SUBSTRATE COMPENSATING CUSTOM RESISTOR

The present application is an application claiming the benefit under 35 USC Section 119(e) of U.S. Provisional Patent Application Ser. No. 60/531,555, filed Dec. 18, 2003. The present application is based on and claims priority from this application, the disclosure of which is hereby expressly incorporated herein by reference in its entirety.

BACKGROUND OF INVENTION

The present invention relates to a probe system that includes a distributed resistor to compensate for the inherent transmission loss of the probe system when connecting a circuit board component to a test instrument. A key feature of the invention is the distributed resistor that decreases attenuation substantially in proportion with the square root of increasing frequency over a range of frequencies.

Electrical test probe systems typically interface test instruments to a piece of equipment-under-test (hereinafter referred to as "EUT"), such as circuit boards, to measure the electrical signal on one or more components on the EUT. Circuit boards components (hereinafter referred generally as "components") typically include one or more integrated circuits (hereinafter "IC devices"), each IC device having a plurality of leads, legs, pins, or combinations of leads, legs, and pins (hereinafter referred to as "leads"). Other circuit board components may include resistors, capacitors, and through-hole pins, for example. Typical test instruments include, for example, oscilloscopes, spectrum analyzers, or other measuring, monitoring, diagnostic, or signal-processing devices (hereinafter "test instruments").

Because probe systems establish electrical connections between test instruments and EUTs for the purpose of observing component activity without influence, the ideal probe system would be easy to connect to the EUT, not load the signal source, and transfer the signal accurately. In other words, the ideal probe system would have infinite input resistance, zero input capacitance, and have a flat transfer response over the entire frequency range. In implementation, however, any probe system will have some loading because the test instrument needs to draw some current; the probe system transfer response will have some variation over the frequency ranges because of stray capacitances, inductances, and losses in the probe system.

The physical geometry and configuration of the probe system affects loading and distortion. A probe system, at a minimum, consists of at least one probe tip (e.g. a single probe tip for a single ended probe and two probe tips for a differential probe), a cable, and a connector. Additional probe system components might include a probing head and/or an amplifier. Cable generally includes a metal conductor that has an associated, non-zero, resistance; this results in dissipated signal power, termed "loss." This loss increases substantially in proportion with the cable length. Additionally, cables generally may include several individual strands, or filaments, braided together with each filament surrounded by a dielectric that also leaks (e.g. has a loss).

In a low-impedance probe system, the cable and other transmission lines in the probe system have a loss that is substantially proportional to the square root of the frequency. The probe tip has an inductance that is primarily a function of the probe tip and/or reference connection length and capacitances that are generally parasitic. These stray inductances and capacitances will create a peak in the frequency response, followed by a drop, as the frequency gets higher. The inductance and capacitance will limit the ability of the probe tip to accurately transfer the signal being measured, and limit the maximum frequency of operation. The probe tip is generally constructed to minimize the inductances and capacitances in order to maximize the frequency range.

Cable loss, therefore, can be quantified as substantially equal to:

$L = k \cdot \sqrt{f}$; where Loss (L) is measured in decibels (dB) and k is a constant determined by the measured loss at a specified frequency (f).

The loss of a low-impedance ($Z_O$) probe at very low frequencies may be expressed as:

$$L = Z_0 \cdot \log\{(R_t + 50)/50\}$$

in a 50-ohm system where $R_t$ is the tip resistor.

To compensate for the inherent cable loss in the probe system, attempts have been made to "tune" the probe for a given frequency range. The peaking in the probe tip can act to partially compensate for the cable loss. Within the target frequency range, the ideal probe will exhibit an improved frequency response to the intercepted signal.

One significant problem with known probe systems is an inherent mismatch of the peaking frequency response of the probe tip and the loss associated with transmission loss in the cable connecting the probe tip to the test instrument. Any probe system will have a natural peaking. Peaking refers to the condition where an input inductance resonates with the input capacitance. Attempts to adapt the physical geometry and configuration of other probe components to compensate for cable loss are inadequate. In addition, although probe tip geometry can be changed try to get the "peaking" to match the cable loss, modifying the probe tip and tip length to tune peaking to cable loss is imperfect because the frequency-related variation in the probe tip does not directly correlate with frequency-related loss in the cable.

BRIEF SUMMARY OF THE INVENTION

The present invention addresses the need for a probe system that compensates for the inherent transmission loss of the probe system when connecting a circuit board component to a test instrument. Such a solution should not rely on matching probe tip peaking to anticipated cable loss.

A key feature of the invention is the distributed resistor that decreases attenuation substantially in proportion with the square root of frequency over a range of frequencies.

A compensating resistor of the present invention includes a substrate with a first termination at one end and a second termination at the other end. A frontside resistor is on the frontside of the substrate and extends between the first termination and the second termination. A backside resistor is on the backside of the substrate. One end of the backside resistor is attached to the first termination, but the other end of the backside resistor is free from the second termination. The frontside resistor and the backside resistor are capacitively coupled through the substrate. An alternative embodiment has includes a metal termination pad on the substrate backside to which the free end of the backside resistor connects. The compensating resistor preferably has an attenuation that decreases proportionally to the square root of frequency over the range of frequencies.

The present invention also includes a method for compensating for the inherent transmission loss of a probe system.

The foregoing and other objectives, features, and advantages of the invention will be more readily understood upon consideration of the following detailed description of the invention, taken in conjunction with the accompanying drawings.

DETAILED DESCRIPTION OF THE INVENTION

The present invention is directed to a loss-compensating distributed resistor (compensating resistor) that may be used in a probe system to provide a flat frequency response for a target frequency range. Specifically the present invention decreases attenuation substantially in proportion with the square root of frequency over a range of frequencies. The distributed resistor does not perform as a traditional resistor at high frequencies, but rather it is used to create an attenuation with the desired shape.

Figure 1:
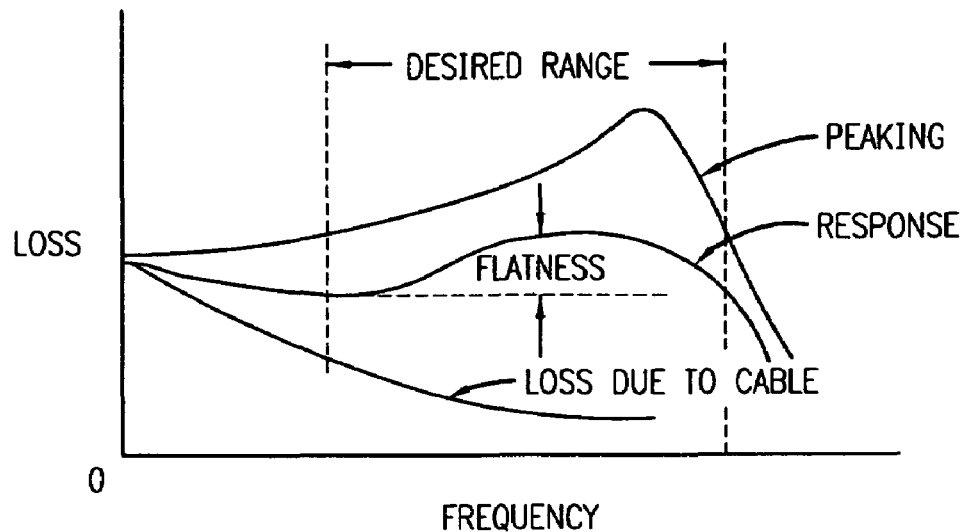
FIG. 1 is a graph of a frequency response signal typical to known probe systems.
Figure 2:
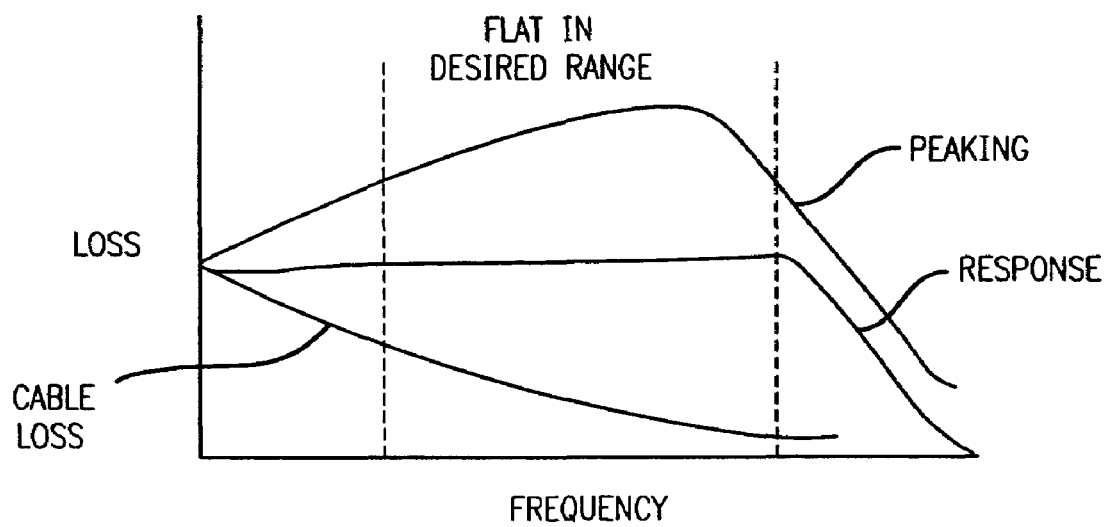
FIG. 2 is a graph of the frequency response signal of an exemplary preferred embodiment of the present invention.

FIG. 1 shows a frequency response signal typical to known probe systems. FIG. 1 shows cable loss increasing with frequency, but probe system peaking (that generally occurs in the probe tip) generally causing the signal to increase with frequency over a specified frequency range. This combination results in a signal frequency response that is not flat over the desired frequency range. In contrast, FIG. 2 shows the frequency response signal of a probe system according to the present invention. The frequency response signal is flat over the desired frequency range.

The transmission loss of a probe system can be tuned by manipulating several factors including the geometry and composition of transmission lines in the probe tip assembly 22 and the length and composition of the cable 24. This loss can be calculated. The present invention compensates for this loss by including at least one distributed resistor 30 in a probe tip assembly 22.

Figure 3:
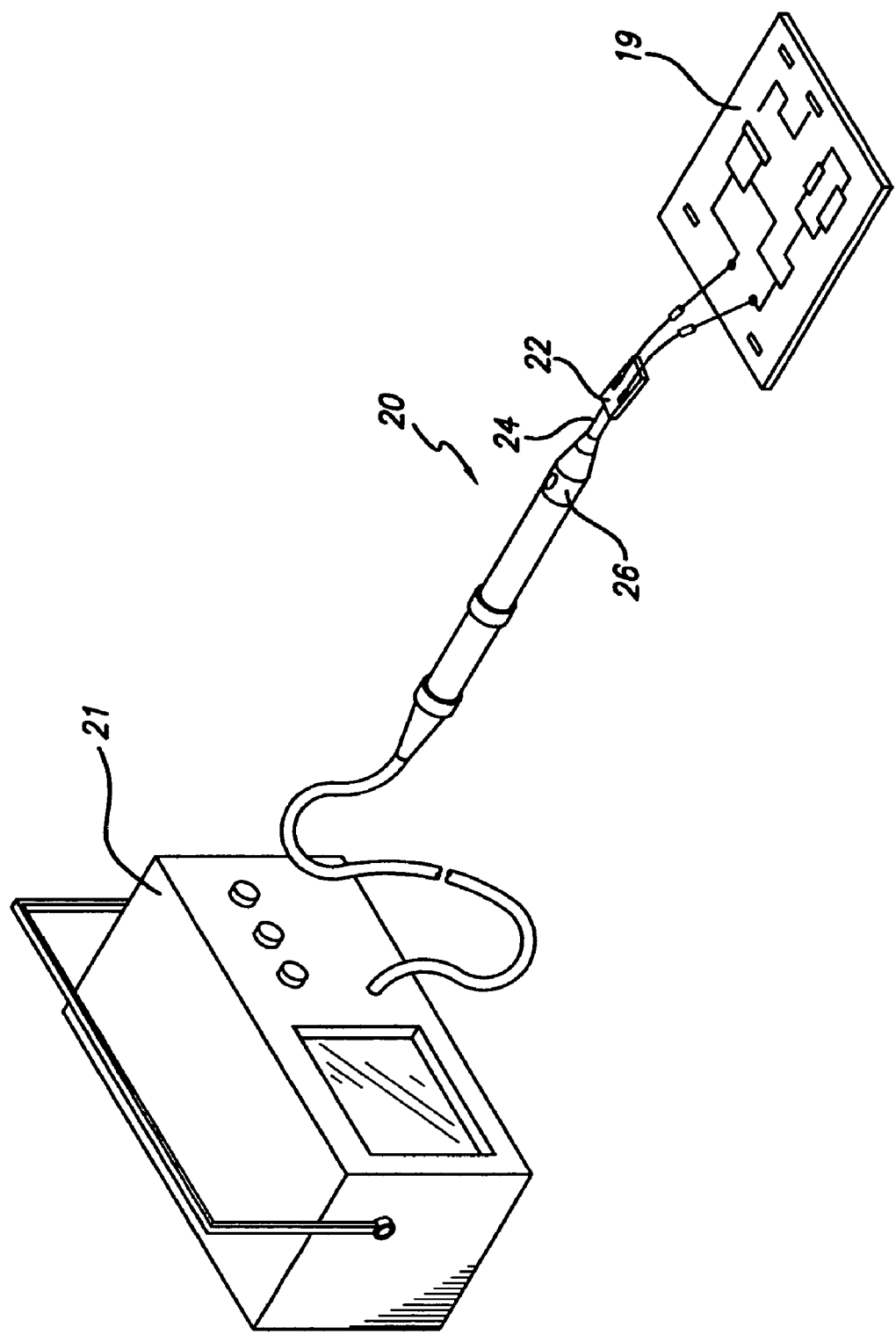
FIG. 3 is a schematic illustration of an exemplary probe system of the present invention in relation to a test instrument and equipment-under-test (EUT).
Figure 4:
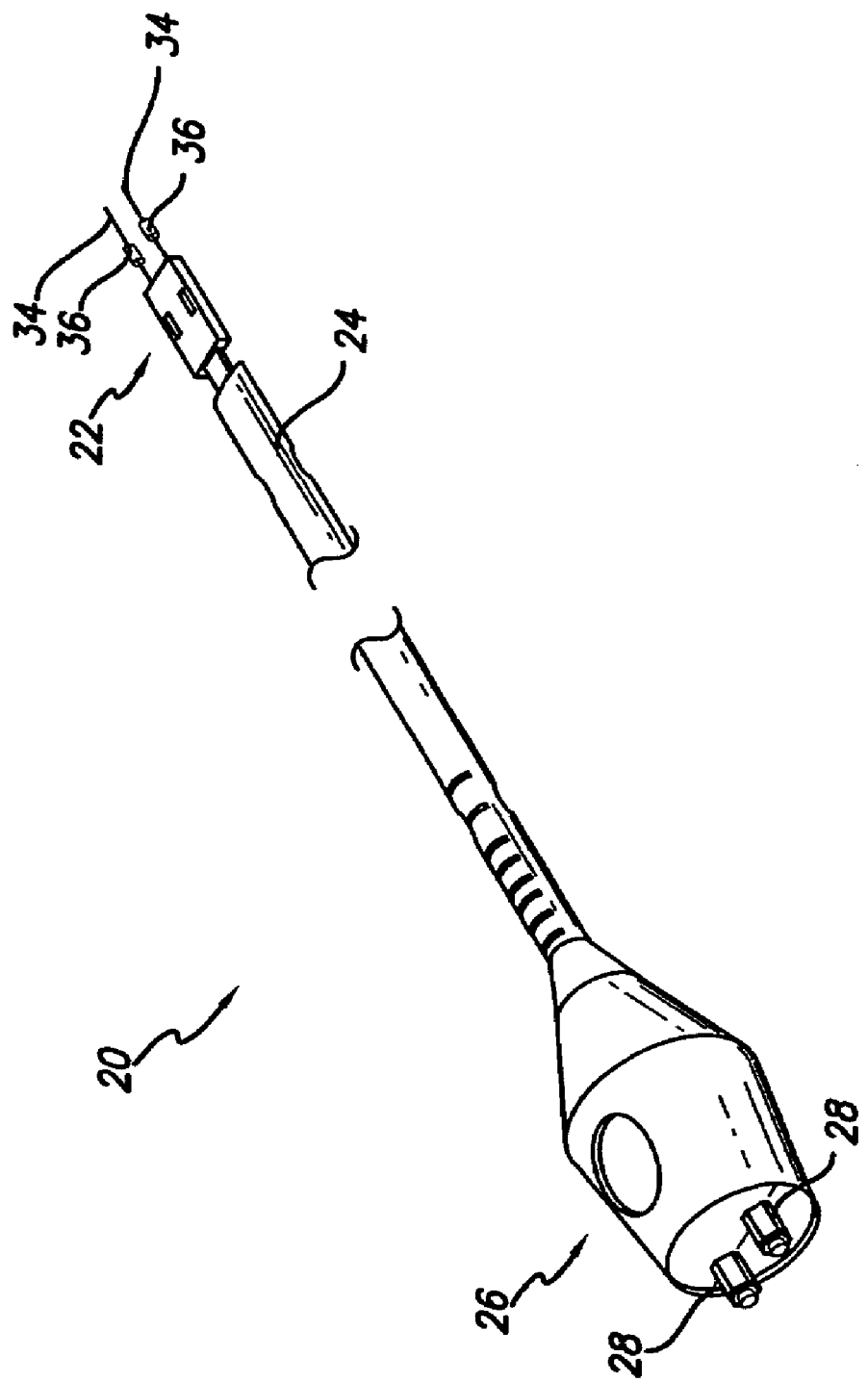
FIG. 4 is an isometric view of an exemplary preferred embodiment of a probe tip system of the present invention.
Figure 5:
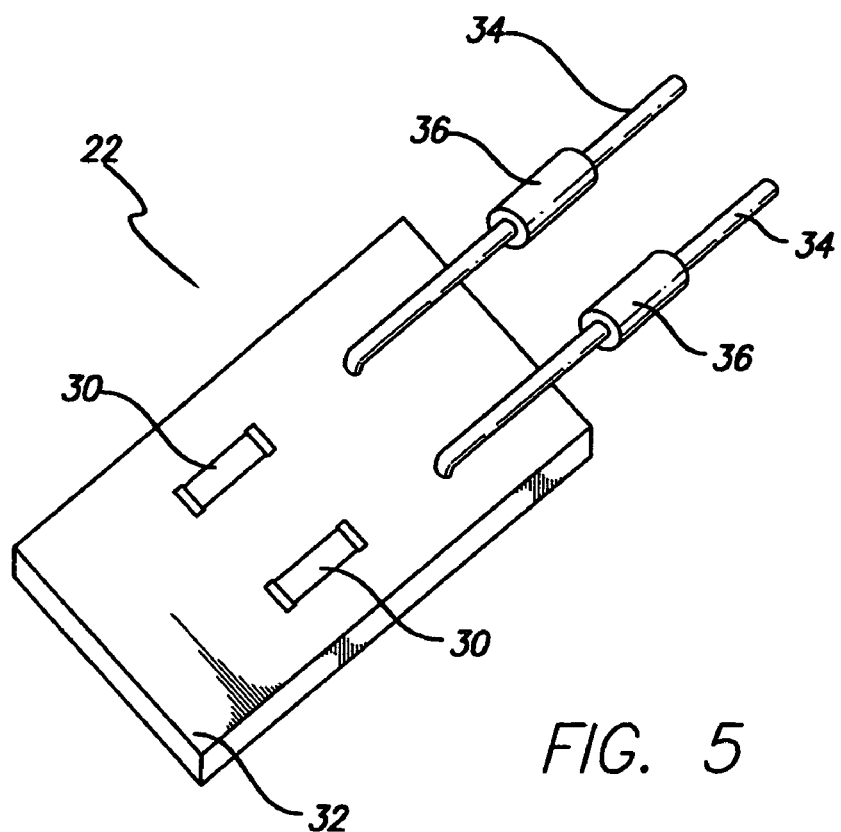
FIG. 5 is an isometric view of an exemplary preferred embodiment of a probe tip assembly of an active differential probe system of the present invention.
Figure 6:
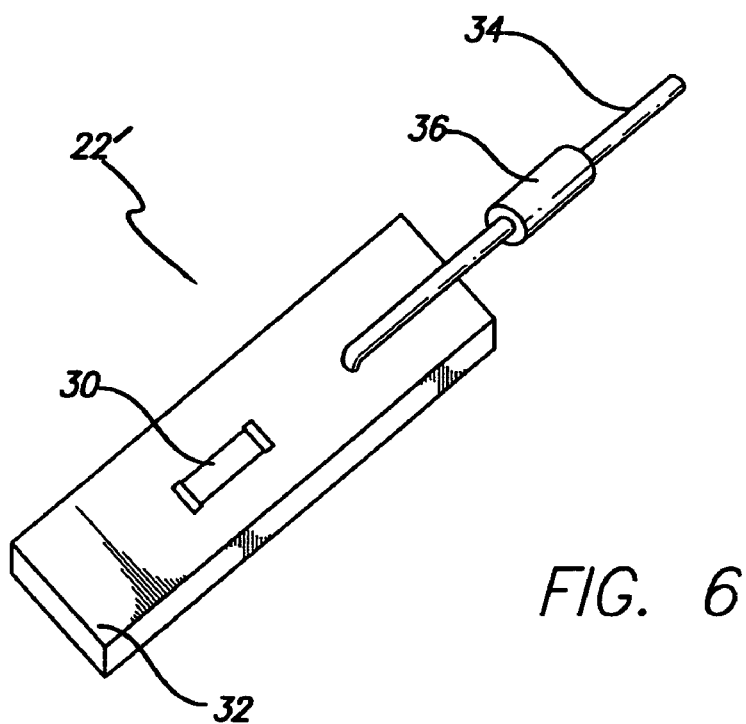
FIG. 6 is an isometric view of an exemplary preferred embodiment of probe tip assembly of an active probe system of the present invention.

FIGS. 3–9 show exemplary physical embodiments of various aspects of the present invention. For example, the probe tip system 20 of the present invention in use is shown in FIG. 3. The exemplary probe tip system 20 is shown in detail in FIG. 4. The exemplary probe tip assemblies 22, 22' are shown in FIGS. 5 and 6. The frontside (FIG. 7) and bottom side (FIGS. 8 and 9) of an exemplary loss-compensating distributed resistor 30 is also shown. These figures are discussed in more detail below.

FIG. 3 is a schematic diagram of a probe tip system 20 according to an exemplary preferred embodiment of the present invention in relation to a typical test instrument 21, such as an oscilloscope, and a circuit board, or component on an equipment-under-test (EUT) 19.

FIG. 4 shows a more detailed view of the exemplary probe tip system 20 of FIG. 3 that includes a probe tip assembly 22, a cable 24, and an interface 26. On a first end of the cable 24 is the probe tip assembly 22 that is interfacable with at least one component on the EUT 19. The probe tip assembly 22 may be temporarily interfacable (e.g. browsing) with the components. The probe tip assembly 22 may be permanently interfacable (e.g. soldering) with the components. On a second end of the cable 24 opposite the probe tip assembly 22 is an interface 26 with connectors 28 adapted to interface (indirectly through an amplifier/cable or in a modified integrated version, directly) removably with a test instrument 21. The cable 24 allows signals received by the probe tip assembly 22 to pass to the interface 26. Although FIG. 4 shows the probe tip assembly 22 of FIG. 5, it should be noted that the probe tip assembly 22' of FIG. 6 would be usable in a similar probe tip system 20.

FIG. 5 shows details of the physical embodiment an exemplary active differential probe tip assembly 22. The shown probe tip assembly 22 includes a printed circuit board (PCB) 32 with two leads 34. The leads 34 may be used to contact selectively a desired EUT 19. In the shown embodiment, the leads 34 each include an optional dampening resistor 36. The PCB 32 also includes a pair of distributed resistors 30 of the present invention.

Figure 12:
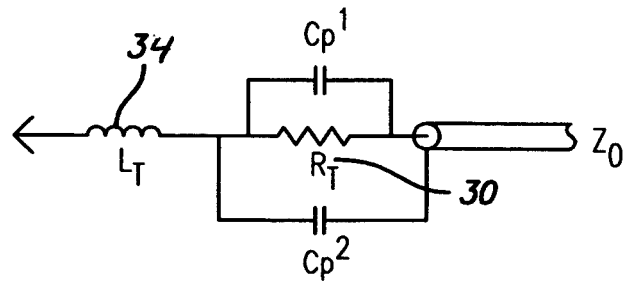
FIG. 12 is a circuit diagram of simplified equivalent circuit of a low impedance probe tip assembly using a distributed resistor of the present invention.
Figure 13:
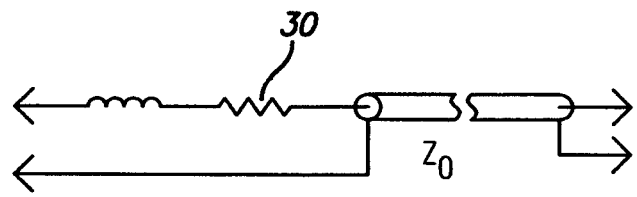
FIG. 13 is a circuit diagram of a passive low impedance probe using a distributed resistor of the present invention.

FIG. 6 shows details of the physical embodiment an exemplary active probe tip assembly 22'. The shown probe tip assembly 22' includes a printed circuit board (PCB) 32 with a single lead 34. The lead 34 may be used to contact selectively a desired EUT 19. In the shown embodiment, the lead 34 includes an optional dampening resistor 36. The PCB 32 also includes a single distributed resistor 30 of the present invention. It should be noted that the same reference numerals have been used to designate substantially identical elements. Elements of this physical embodiment may be implemented as shown in FIGS. 12 and 13. A reference connection (e.g. like the ones shown in FIGS. 13 and 15) would most likely be necessary in an embodiment such as this one.

Figure 7:
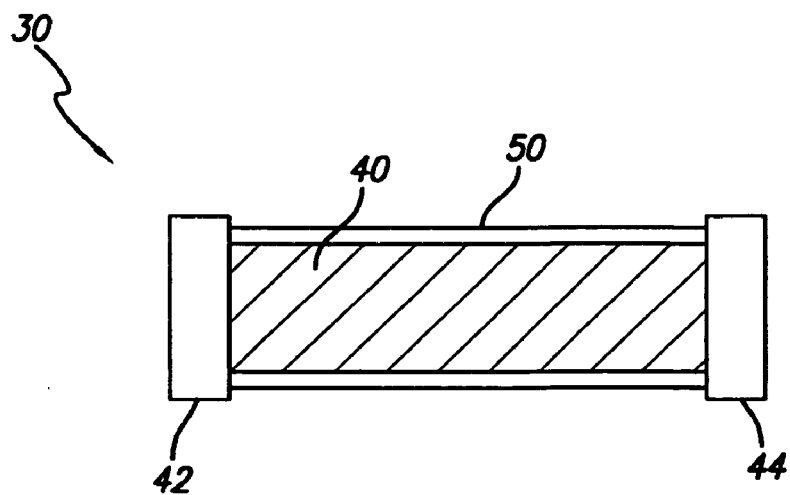
FIG. 7 is a plan view of the frontside of an exemplary loss-compensating distributed resistor the present invention.
Figure 8:
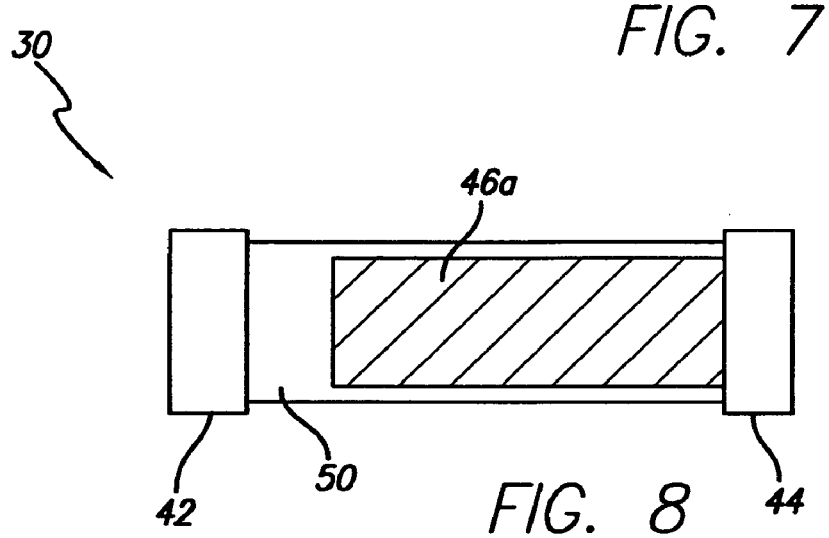
FIG. 8 is a plan view of a first exemplary bottom side of the exemplary loss-compensating distributed resistor of FIG. 7.
Figure 9:
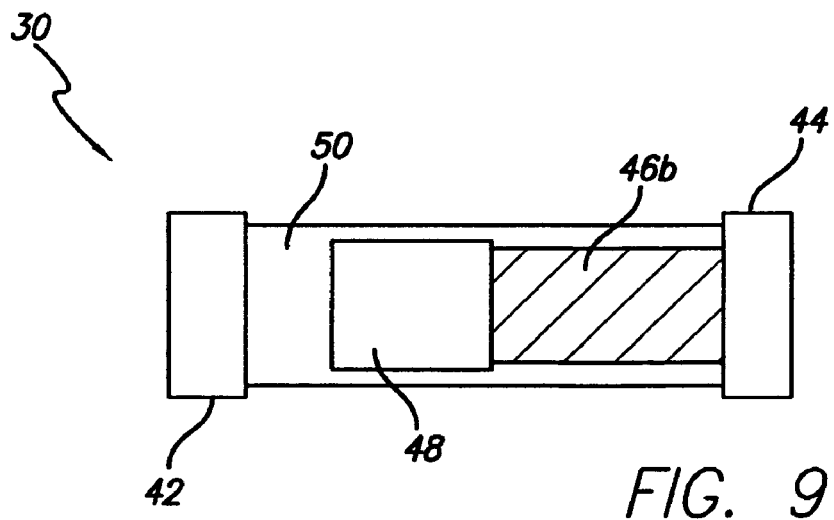
FIG. 9 is a plan view of a second exemplary bottom side of the exemplary loss-compensating distributed resistor of FIG. 7, the bottom side having an additional metal termination pad.

FIGS. 7–9 show an exemplary loss-compensating distributed resistor 30 of the present invention. FIG. 7 shows the frontside of the distributed resistor 30 and FIGS. 8 and 9 show two exemplary embodiments of the bottom side of the distributed resistor 30. FIG. 7 shows the frontside (main)

resistor 40 that connects with two end terminations 42, 44. FIG. 8 shows a first embodiment of a backside resistor 46a that is only connected to one of the terminations 44. FIG. 9 shows a second embodiment of a backside resistor 46b that is only connected to one of the terminations 44 and also has a metal termination pad 48 on the open end of backside resistor 46b that allows the resistance to be measured, and perhaps trimmed (which would improve the common mode rejection ratio). The frontside resistor 40 and backside resistor 46a, 46b are capacitively coupled using a substrate 50. This configuration creates a distributed resistor 30 that has an attenuation that decreases with frequency. Specifically, the attenuation decreases proportionally to the square root of frequency. When used in a probe tip system 20, this distributed resistor 30 will allow the signal to increase proportionally to the square root of frequency. Since the probe tip system 20 also includes cables and interconnect paths that have insertion loss that increases with the square root of frequency, the resulting system response of the combination can be made flat. The specific parameters (resistor length, width, and resistivity, substrate material, thickness, and size) are adjusted to give a response that matches the losses in the system. These figures show exemplary physical embodiments of how the circuits shown in FIGS. 10 and 11 might be implemented.

Figure 10:
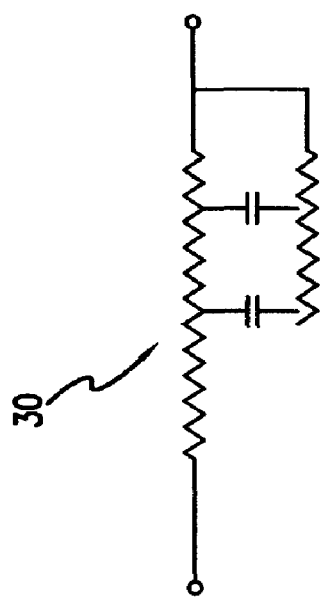
FIG. 10 is a circuit diagram of a theoretical distributed resistor having distributed capacitance.

FIG. 10 is a circuit diagram of a theoretical distributed resistor having distributed capacitance. This theoretical distributed resistor seeks to create $R_x(f)$ to have an attenuation change with frequency that will compensate for the loss of a cable. In this case, the attenuation should decrease with frequency to compensate for the cable.

Figure 11:
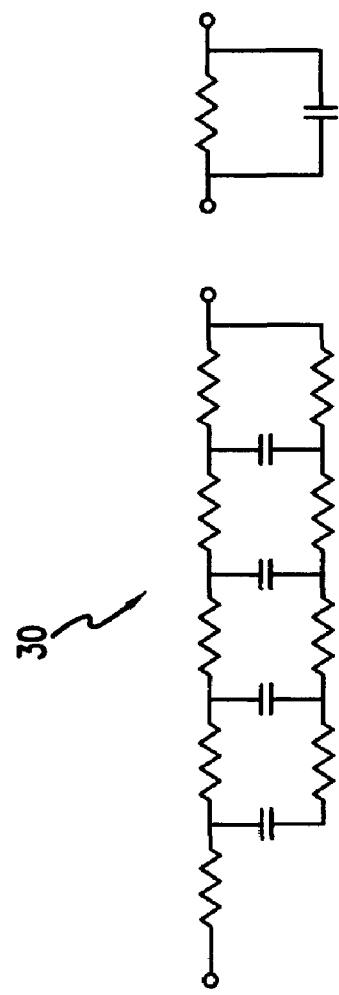
FIG. 11 is a circuit diagram of a simulated distributed resistor having distributed capacitance.

FIG. 11 is a circuit diagram of a simulated distributed resistor having distributed capacitance. A parallel RC circuit may be added to the output so that enough capacitance can get through the resistor substrate to compensate for the lowest frequencies of interest.

A first exemplary preferred embodiment of the distributed resistor 30 is a miniature surface-mount distributed resistor 30 having a frontside as shown in FIG. 7 and a backside as shown in FIG. 9. This exemplary embodiment has a frontside resistance of substantially about 1.95 K Ohms and a backside resistance of substantially about 370 Ohms. The frontside (main) resistor 40 connects with the two end terminations 42, 44. The backside resistor 46b is only connected to one of the terminations 44 and has a metal termination pad 48 on the open end of backside resistor 46b that allows the resistance to be measured, and perhaps trimmed. The frontside resistor 40 and backside resistor 46a, 46b are capacitively coupled using the substrate 50. In this embodiment, the substrate 50 is a 96% alumina substrate having a thickness of 0.050"±0.0005", a length of 0.600"±0.0050", a width of 0.200"±0.0050", and a height of 0.070"±0.0030". In this embodiment, the resistors are resistor film with glass encapsulant. The resistors may be printed using thick film inks to get the desired resistivity. In this embodiment, the terminations 42, 44 are caps that cover the ends of the substrate 50. The terminations 42, 44 may be PD-Ag with nickel barrier. The distance between the inner edge of the metal termination pad 48 and the inner edge of the end terminations 42 is 0.150"±0.0020".

A second exemplary preferred embodiment of the distributed resistor 30 is a miniature surface-mount distributed resistor 30 having a frontside as shown in FIG. 7 and a backside as shown in FIG. 9. This exemplary embodiment has a frontside resistance of substantially about 3.95 K Ohms and a backside resistance of substantially about 560 Ohms. The frontside (main) resistor 40 connects with the two end terminations 42, 44. The backside resistor 46b is only connected to one of the terminations 44 and has a metal termination pad 48 on the open end of backside resistor 46b that allows the resistance to be measured, and perhaps trimmed. The backside resistor 46b of this embodiment is slightly shorter than the backside resistor 46b of the first exemplary preferred embodiment. The frontside resistor 40 and backside resistor 46a, 46b are capacitively coupled using the substrate 50. In this embodiment, the substrate 50 is a 96% alumina substrate having a thickness of 0.050"±0.0005", a length of 0.600"±0.0050", a width of 0.200"±0.0050", and a height of 0.070"±0.0030". In this embodiment, the resistors are resistor film with glass encapsulant. The resistors may be printed using thick film inks to get the desired resistivity. In this embodiment, the terminations 42, 44 are caps that cover the ends of the substrate 50. The terminations 42, 44 may be PD-Ag with nickel barrier. The distance between the inner edge of the metal termination pad 48 and the inner edge of the end terminations 42 is 0.200"±0.0020".

It should be noted that the specific materials discussed for the elements above are meant to be exemplary and are not meant to limit the scope of the invention. For example, although the substrate 50 in the two examples is a 96% alumina substrate, almost any substrate could be used including, but not limited to glass or quartz substrates. The type of material would be at least partially based on the dielectric constant of the material because that sets the coupling capacitance of the substrate, as well as the desired thickness of the substrate. For example, if a 96% alumina substrate were used, it would have a dielectric constant of 9.8 and would set the coupling capacitance of the substrate to an appropriate capacitance for the exemplary embodiments discussed above.

Figure 14:
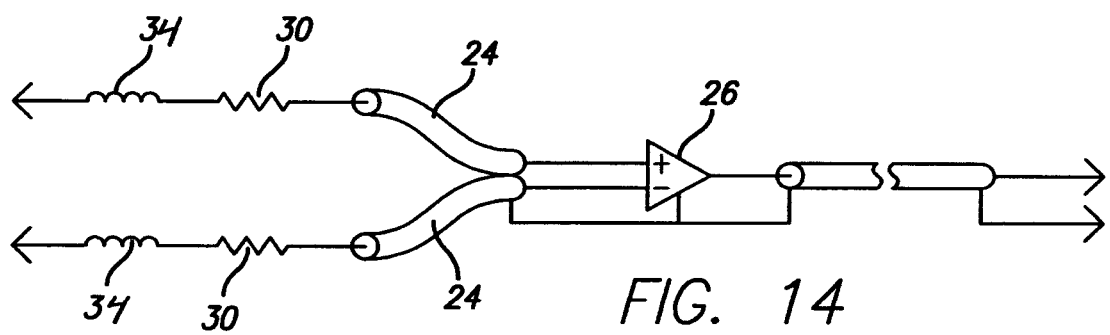
FIG. 14 is a circuit diagram of an active differential probe using a distributed resistor of the present invention.
Figure 15:
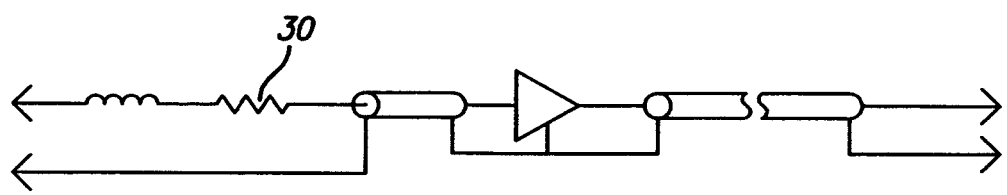
FIG. 15 is a circuit diagram of an active probe using a distributed resistor of the present invention.

FIGS. 12–15 are simplified circuit diagrams using a distributed resistor of the present invention. FIG. 12 shows a simplified equivalent circuit of a low impedance probe tip. FIG. 13 shows a distributed resistor in a passive low impedance probe system. FIG. 14 shows a distributed resistor in an active differential probe system. FIG. 15 shows a distributed resistor in an active probe system.

For exemplary purposes, FIG. 14 has been labeled to show elements of the probe tip system 20 and probe tip assembly 22. Specifically, the inductance of the leads 34 are connected to their respective distributed resistors 30 that are, in turn, connected to the cable 24 and the interface 26. Common Mode Rejection Ration (CMRR) is an important parameter for differential probes. The resistors have to be well matched to insure that common mode signals are attenuated equally in both tips. Otherwise, there will be a differential component created that will be sent to the measuring instrument.

The present invention also includes a method for compensating for the inherent transmission loss of a probe system. The method includes the first step of determining the transmission loss (L) of the probe system wherein the transmission loss $(L)=k \cdot \sqrt{f}$. This step may be done by calculation and/or measurement. Then, at least one compensating resistor is provided in a probe system. The compensating resistor has an attenuation that decreases proportionally to $\sqrt{f}$. Adding the transmission loss (L) to the attenuation will yield a constant value across a frequency range. It should be noted that the method of the present invention may include the step of creating the at least one compensating resistor according to the information set forth herein. It should be noted that the key parameters used for creating the compensating resistor are the relationship between the frontside and backside resistor values, the coupling (capacitance) between the resistors, and the loss of the cable that for which the resistor is designed to compensate.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A distributed resistor for use in a probe system, said probe system operating over a range of frequencies, said distributed resistor comprising:
   (a) a substrate, said substrate having a substrate frontside and oppositely positioned substrate backside, said substrate having a substrate first end and oppositely positioned substrate second end;
   (b) a first termination at said substrate first end and a second termination at said substrate second end;
   (c) a frontside resistor on said substrate frontside, said frontside resistor having a first frontside resistor end and a second frontside resistor end, said first frontside resistor end connected to said first termination and said second frontside resistor end connected to said second termination;
   (d) a backside resistor on said substrate backside, said backside resistor having a first backside resistor end and a second backside resistor end, said first backside resistor end connected to said first termination and said second backside resistor end free from said second termination;
   (e) said frontside resistor and said backside resistor capacitively coupled through said substrate; and
   (f) said distributed resistor having an attenuation that decreases proportionally to the square root of frequency over said range of frequencies.

2. The distributed resistor of claim 1 further comprising a metal termination pad on said substrate backside between said first termination and said second termination, said second backside resistor end connected to said metal termination pad.

3. The distributed resistor of claim 2 wherein said metal termination pad enables trimming.

4. The distributed resistor of claim 2 wherein said metal termination pad enables measurement of resistance.

5. A compensating resistor comprising:
   (a) a substrate, said substrate having a substrate frontside and oppositely positioned substrate backside, said substrate having a substrate first end and oppositely positioned substrate second end;
   (b) a first termination at said substrate first end and a second termination at said substrate second end;
   (c) a frontside resistor on said substrate frontside, said frontside resistor having a first frontside resistor end and a second frontside resistor end, said first frontside resistor end connected to said first termination and said second frontside resistor end connected to said second termination;
   (d) a backside resistor on said substrate backside, said backside resistor having a first backside resistor end and a second backside resistor end, said first backside resistor end connected to said first termination and said second backside resistor end free from said second termination;
   (e) said frontside resistor and said backside resistor capacitively coupled through said substrate; and
   (f) a metal termination pad on said substrate backside between said first termination and said second termination, said second backside resistor end connected to said metal termination pad.

6. The compensating resistor of claim 5 wherein said metal termination pad enables trimming.

7. The compensating resistor of claim 5 wherein said metal termination pad enables measurement of resistance.

8. The compensating resistor of claim 5 said compensating resistor having an attenuation that decreases proportionally to the square root of frequency over said range of frequencies.

9. A method for compensating for the inherent transmission loss of a probe system:
   (a) determining the transmission loss (L) of said probe system wherein said transmission loss $(L)=k\cdot\sqrt{f}$;
   (b) providing at least one compensating resistor in said probe system, said compensating resistor having an attenuation that decreases proportionally to $\sqrt{f}$;
   (c) wherein adding said transmission loss (L) to said attenuation will yield a constant value across a frequency range.

10. The method of claim 9 wherein said step of determining said transmission loss (L) further comprises the step of calculating said transmission loss (L).

11. The method of claim 9 wherein said step of determining said transmission loss (L) further comprises the step of measuring said transmission loss (L).

12. The method of claim 9 further comprising the step of creating said at least one compensating resistor, prior to said step of providing said at least one compensating resistor.

* * * * *

UNITED STATES PATENT AND TRADEMARK OFFICE
CERTIFICATE OF CORRECTION

PATENT NO.         : 7,042,232 B1
APPLICATION NO.    : 11/018059
DATED              : May 9, 2006
INVENTOR(S)        : Jacobs It is certified that error appears in the above-identified patent and that said Letters Patent is hereby corrected as shown below:

<u>Title Page.</u>
Item (57), Please amend the abstract to read as follows:
-- A compensating resistor includes a substrate with a first termination at one end and a second termination at the other end. A frontside resistor is on the frontside of the substrate and extends between the first termination and the second termination. A backside resistor is on the backside of the substrate. One end of the backside resistor is attached to the first termination, but the other end of the backside resistor is free from the second termination. The frontside resistor and the backside resistor are capacitively coupled through the substrate. An alternative embodiment includes a metal termination pad on the substrate backside to which the free end of the backside resistor connects. The compensating resistor preferably has an attenuation that decreases proportionally to the square root of frequency over the range of frequencies. --

<u>Column 1,</u>
Line 24, "Circuit boards components" should read -- Circuit board components --.

<u>Column 2,</u>
Line 34, "can be changed try to get" should read -- can be changed to try to get --; and
Line 60, "embodiment has includes a" should read -- embodiment includes a --.

<u>Column 3,</u>
Line 23, "embodiment of probe tip" should read -- embodiment of a probe tip --;
Line 26, "distributed resistor the present invention" should read -- distributed resistor of the present invention --; and
Line 38, "diagram of simplified equivalent" should read -- diagram of a simplified equivalent --.

<u>Column 4,</u>
Line 17, "resistor 30 is also shown." should read -- resistor 30 are also shown. --;
Line 41, "physical embodiment an" should read -- physical embodiment of an --; and
Line 49, "physical embodiment an" should read -- physical embodiment of an --.

<u>Column 5,</u>
Line 21, "resistivity, substrate" should read -- resistivity, and substrate --;
Line 51, "0.050" should read -- 0.0050 --;
Line 52, "0.600" should read -- 0.0600 --;
Line 52, "0.200" should read -- 0.0200 --;
Line 53, "0.070" should read -- 0.0070 --; and
Line 60, "0.150" should read -- 0.0150 --.

UNITED STATES PATENT AND TRADEMARK OFFICE
CERTIFICATE OF CORRECTION

PATENT NO. : 7,042,232 B1
APPLICATION NO. : 11/018059
DATED : May 9, 2006
INVENTOR(S) : Jacobs It is certified that error appears in the above-identified patent and that said Letters Patent is hereby corrected as shown below:

Column 6,
Line 11, "0.050" should read -- 0.0050 --;
Line 11, "0.600" should read -- 0.0600 --;
Line 12, "0.200" should read -- 0.0200 --;
Line 12, "0.070" should read -- 0.0070 --;
Line 20, "0.200" should read -- 0.0200 --; and
Line 26, "limited to glass" should read -- limited to, glass --.

Column 7,
Line 2, "cable that for" should read -- cable for --.

Signed and Sealed this

Twenty-sixth Day of June, 2007

JON W. DUDAS
*Director of the United States Patent and Trademark Office*